United States Patent
Deak et al.

(10) Patent No.: US 10,066,940 B2
(45) Date of Patent: Sep. 4, 2018

(54) SINGLE-CHIP DIFFERENTIAL FREE LAYER PUSH-PULL MAGNETIC FIELD SENSOR BRIDGE AND PREPARATION METHOD

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 0 days.

(21) Appl. No.: 15/514,952

(22) PCT Filed: Sep. 25, 2015

(86) PCT No.: PCT/CN2015/090721
§ 371 (c)(1),
(2) Date: Mar. 28, 2017

(87) PCT Pub. No.: WO2016/045614
PCT Pub. Date: Mar. 31, 2016

(65) Prior Publication Data
US 2017/0211935 A1    Jul. 27, 2017

(30) Foreign Application Priority Data
Sep. 28, 2014 (CN) .......................... 2014 1 0508055

(51) Int. Cl.
*G01R 33/02* (2006.01)
*G01C 17/28* (2006.01)
(Continued)

(52) U.S. Cl.
CPC .............. *G01C 17/28* (2013.01); *G01R 3/00* (2013.01); *G01R 17/00* (2013.01); *G01R 33/09* (2013.01)

(58) Field of Classification Search
CPC .. G01R 33/09; G01R 33/093; G01R 33/0017; G01R 33/098; G01R 17/105; H01L 43/02; H01L 43/08; H01L 43/12
See application file for complete search history.

(56) References Cited

U.S. PATENT DOCUMENTS

| 2012/0007598 | A1  | 1/2012 | Lo et al. | |
| 2014/0070795 | A1* | 3/2014 | Kolb ....................... | G01R 33/07 324/202 |
| 2015/0137804 | A1* | 5/2015 | Yuan .................. | G01R 33/0005 324/244 |

FOREIGN PATENT DOCUMENTS

| CN | 103412269 | 11/2013 |
| CN | 103630855 | 3/2014 |

(Continued)

OTHER PUBLICATIONS

"International Application No. PCT/CN2015/090721, International Search Report and Written Opinion dated Dec. 15, 2015", (Dec. 15, 2015), 12 pgs.

*Primary Examiner* — Minh N Tang
(74) *Attorney, Agent, or Firm* — Schwegman Lundberg & Woessner, P.A.

(57) ABSTRACT

Provided are a single-chip differential free layer push-pull magnetic field sensor bridge and preparation method, the magnetic field sensor bridge comprising: a substrate, a staggered soft magnetic flux concentrator array, and a GMR spin valve or a TMR magnetoresistance sensing unit array having a magnetic sensing axis in an X-direction on the substrate. A soft magnetic flux concentrator comprises sides parallel to an X-axis and a Y-axis, and four corners sequentially labeled as A, B, C and D clockwise from an upper left position. Magnetoresistive sensing units are located at gaps between the soft magnetic flux concentrators. Additionally, the magnetoresistive sensing units corresponding to the A (Continued)

and C corner positions and B and D corner positions of the soft flux concentrators are defined as push magnetoresistive sensing units and pull magnetoresistive sensing units, respectively. The push magnetoresistive sensing units are electrically interconnected into one or more push arms, and the pull magnetoresistive sensing units are electrically interconnected into one or more pull arms. The push arms and the pull arms are electrically interconnected to form a push-pull sensor bridge. The present invention has low power consumption, high magnetic field sensitivity, and can measure a magnetic field in the Y-direction.

28 Claims, 10 Drawing Sheets

(51) Int. Cl.
  *G01R 3/00* (2006.01)
  *G01R 17/00* (2006.01)
  *G01R 33/09* (2006.01)

(56) References Cited

FOREIGN PATENT DOCUMENTS

| | | |
|---|---|---|
| CN | 203587785 | 5/2014 |
| CN | 103913709 | 7/2014 |
| CN | 103954920 | 7/2014 |
| CN | 104280700 | 1/2015 |
| CN | 204389663 | 6/2015 |
| JP | 2013224921 | 10/2013 |
| WO | WO-2016045614 | 3/2016 |

* cited by examiner

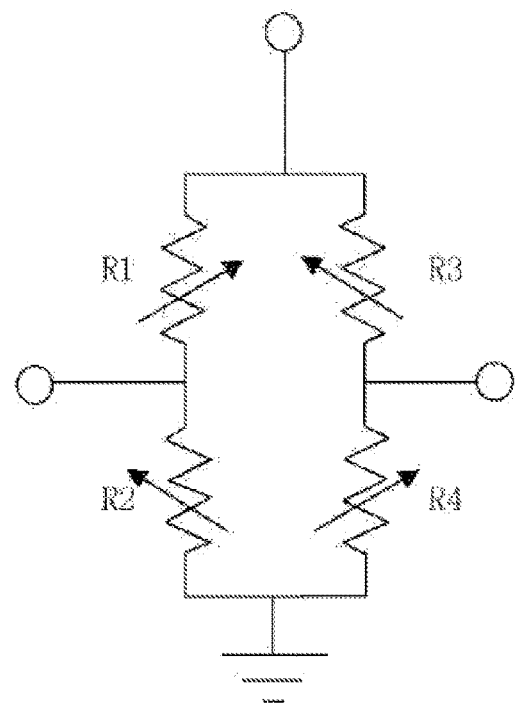
FIG. 1
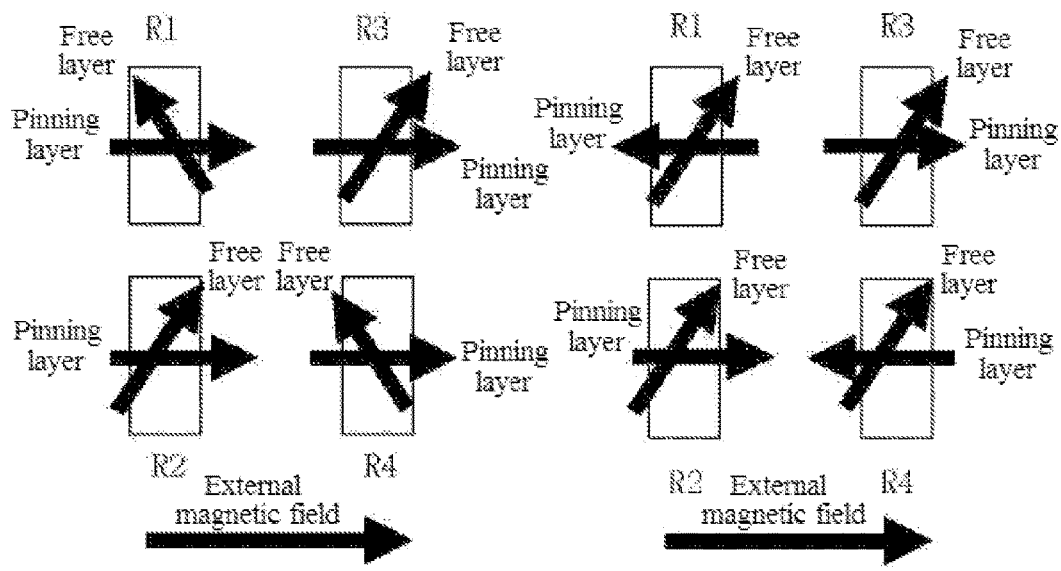
FIG. 2a  FIG. 2b

SINGLE-CHIP DIFFERENTIAL FREE LAYER PUSH-PULL MAGNETIC FIELD SENSOR BRIDGE AND PREPARATION METHOD

PRIORITY CLAIM TO RELATED APPLICATIONS

This application is a U.S. national stage application filed under 35 U.S.C. § 371 from International Application Serial No. PCT/CN 2015/090721, which was filed 25 Sep. 2015, and published as WO2016/045614 on 31 Mar. 2016, and which claims priority to Chinese Application No. 201410508055.3, filed 28 Sep. 2014, which applications and publication are incorporated by reference as if reproduced herein and made a part hereof in their entirety, and the benefit of priority of each of which is claimed herein.

TECHNICAL FIELD

The present invention relates to the field of magnetic sensors, and in particular, to a single-chip differential free layer push-pull magnetic field sensor bridge and a preparation method thereof.

BACKGROUND ART

In a process of designing two-axis and three-axis magnetic compass chips, it is necessary to use X-axis and Y-axis magnetic sensors at the same time. A magnetoresistive sensing unit usually has a single magnetic field sensing axis, for example, has a magnetic sensing axis in an X direction. For providing a magnetic sensing axis in a Y direction, it is common to rotate the X-direction magnetic field sensing unit by 90 degrees, to accordingly obtain a Y-direction magnetic field sensing unit. Next, in order to improve magnetic field sensitivity of the X-axis and Y-axis magnetoresistive sensors, a push-pull bridge is generally adopted, wherein a push arm and a pull arm are manufactured in a discrete manner, that is, one of them is rotated by 180 degrees relative to the other. In this way, the push arm and the pull arm have opposite pinning layer magnetization directions, while having identical freelayer magnetization directions. For example, FIG. 2a is a schematic diagram of a magnetization state of magnetoresistive sensing units with pinning layers of such wire-bond type, wherein the push arm chips and the pull arm chips are connected using wire-bonds.

The Y-axis magnetoresistive sensor proposed above mainly has the following problems:

1) When X-axis and Y-axis magnetoresistive sensors are prepared on a same plane at the same time, as the X-axis and Y-axis magnetoresistive sensors are both discrete elements, it is impossible to implement integrated manufacturing, thus increasing complexity of the process and affecting measurement precision of the two-axis or three-axis sensor.

2) The push arms and the pull arms cannot be integrated on the same chip, and it is necessary to connect discrete chips using wire-bonds which increases the complexity of the process and affects the measurement precision of the sensor.

SUMMARY OF THE INVENTION

To solve the problems existing above, the present invention proposes a single-chip differential free layer push-pull magnetic field sensor bridge and a preparation method thereof, which uses flux concentrators to distort the direction of a Y magnetic field in order to obtain magnetic field components in -X and X directions. In this way, all magnetoresistive sensing units have identical pinning layer magnetization directions, and push arms and pull arms are implemented through deflection of free layers in opposing directions. FIG. 2a is a schematic diagram of a magnetization state of magnetoresistive units of such a differential free layer type.

The single-chip differential free layer push-pull magnetic field sensor bridge proposed in the present invention includes:

a substrate on an X-Y plane;

a staggered soft magnetic flux concentrator array;

wherein each soft magnetic flux concentrator has sides parallel to an X-axis and a Y-axis, and four corners sequentially labeled as A, B, C and D clockwise from an upper left position; and a magnetoresistive sensing unit array on the substrate, including magnetoresistive sensing units located at gaps between the soft magnetic flux concentrators;

wherein the magnetoresistive sensing units near the A and C corner positions of the soft magnetic flux concentrators are referred to as push magnetoresistive sensing units;

the magnetoresistive sensing units near the B and D corner positions of the soft magnetic flux concentrators are referred to as pull magnetoresistive sensing units;

all the push magnetoresistive sensing units are electrically interconnected into one or more push arms;

all the pull magnetoresistive sensing units are electrically interconnected into one or more pull arms; and all the push arms and all the pull arms are electrically interconnected to form a push-pull sensor bridge.

Preferably, the magnetoresistive sensing units are GMR spin valves or TMR sensing units, and in the absence of an external magnetic field, pinning layer magnetization directions of all the magnetoresistive sensing units are aligned parallel to a Y-axis direction, and freelayer magnetization directions of all the magnetoresistive sensing units are aligned in the same direction parallel to an X-axis direction.

Preferably, the staggered soft magnetic flux concentrator array includes first soft magnetic flux concentrators and second soft magnetic flux concentrators, the first soft magnetic flux concentrators and the second soft magnetic flux concentrators are both arranged into columns parallel to the Y-axis direction and into rows parallel to the X-axis direction, the dimension of the soft magnetic flux concentrators is Ly in the Y-axis direction and is Lx in the X-axis direction, a gap between respective adjacent rows of the first soft magnetic flux concentrators and the second soft magnetic flux concentrators along the Y-axis direction is ygap, and a distance at which the columns of the second soft magnetic flux concentrators move along the Y-axis direction relative to the columns of the first soft magnetic flux concentrators is (Ly+ygap)/2.

Preferably, a row direction of the magnetoresistive sensing unit array is parallel to the X-axis direction and a column direction thereof is parallel to the Y-axis direction, columns of the magnetoresistive sensing unit array are located at centers of the gaps between the adjacent columns of the first soft magnetic flux concentrators and the second soft magnetic flux concentrators, the push magnetoresistive sensing units are respectively corresponding to the A and C corner positions of the first and second soft magnetic flux concentrators at the same time, the second soft magnetic flux concentrators have a positive Y-axis displacement relative to the first soft magnetic flux concentrators, the pull magnetoresistive sensing units are respectively corresponding to the B and D corner positions of the first and second soft magnetic flux concentrators at the same time, and the second soft magnetic flux concentrators have a negative Y-axis equivalent displacement relative to the first soft magnetic flux concentrators.

Preferably, each column and each row of the magnetoresistive sensing unit array are both formed by the push magnetoresistive sensing units and the pull magnetoresistive sensing units arranged alternately.

Preferably, each column of the magnetoresistive sensing unit array includes push magnetoresistive sensing units and pull magnetoresistive sensing units arranged alternately, the magnetoresistive sensing unit array includes push magnetoresistive sensing unit rows and pull magnetoresistive sensing unit rows arranged alternately, the push magnetoresistive sensing unit rows are formed by the push magnetoresistive sensing units, and the pull magnetoresistive sensing unit rows are formed by the pull magnetoresistive sensing units.

Preferably, each row of the magnetoresistive sensing unit array includes push magnetoresistive sensing units and pull magnetoresistive sensing units arranged alternately, columns of the magnetoresistive sensing unit array are push magnetoresistive sensing unit columns and pull magnetoresistive sensing unit columns arranged alternately, the push magnetoresistive sensing unit columns are formed by the push magnetoresistive sensing units, and the pull magnetoresistive sensing unit columns are formed by the pull magnetoresistive sensing units.

Preferably, the bias voltage, the ground, and the signal output end of the push-pull magnetic field sensor bridge are electrically interconnected to a bonding pad on top of the substrate or connected to a bonding pad on the bottom of the substrate through TSV.

Preferably, in the absence of an external magnetic field, the magnetoresistive sensing units make magnetization directions of magnetic free layers of the magnetoresistive sensing units perpendicular to magnetization directions of magnetic pinning layers thereof in at least one manner of permanent magnet biasing, double exchange interaction, and shape anisotropy.

Preferably, the number of the magnetoresistive sensing units on the push arms and the number of the magnetoresistive sensing units on the pull arms are the same.

Preferably, rotation angles of free layers of the magnetoresistive sensing units on the push arms and the magnetoresistive sensing units on the pull arms relative to magnetization directions of respective pinning layers are the same in amplitude and opposite in direction.

Preferably, the push-pull magnetic field sensor bridge is a half bridge, a full bridge or a quasi bridge.

Preferably, the substrate is made of glass or a silicon wafer, and the substrate includes an ASIC chip or the substrate is connected to another ASIC chip.

Preferably, the soft magnetic flux concentrator is an alloy soft magnetic material including one or more of Fe, Ni, and Co elements.

Preferably, the single-chip differential free layer push-pull magnetic field sensor bridge further includes test coils, the test coils being respectively located directly above or directly below the magnetoresistive sensing units, current directions of the test coils being parallel to the Y-axis direction, and during a test, current flowing through the test coils respectively corresponding to the push magnetoresistive sensing units and the pull magnetoresistive sensing units being opposite in direction and identical in magnitude.

Preferably, the single-chip differential free layer push-pull magnetic field sensor bridge further includes reset coils, the reset coils being located directly below or directly above the magnetoresistive sensors, current directions of the reset coils being parallel to the X-axis direction, and current flowing through the reset coils respectively corresponding to the push magnetoresistive sensing units and the pull magnetoresistive sensing units being identical in magnitude and identical in direction.

The present invention further provides a preparation method of a single-chip differential free layer push-pull magnetic field sensor bridge, the method including the following steps:

1) depositing a stacked layer of thin-film materials of magnetoresistive sensing units on a wafer surface, and setting pinning layer magnetization directions of the thin-film materials;

2) establishing a bottom electrode, and establishing patterns of the magnetoresistive sensing units on the thin-film materials of the magnetoresistive sensing units by using a first relevant process;

3) depositing a second insulation layer above the magnetoresistive sensing units, and forming a through hole for electrically interconnecting the magnetoresistive sensing units by using a second relevant process;

4) depositing a top metal layer above the through hole, forming a top electrode through the first relevant process, and wiring among the magnetoresistive sensing units;

5) depositing a third insulation layer above the top metal layer;

6) depositing and patterning the soft magnetic flux concentrator above the third insulation layer; and 7) depositing a passivation layer above the soft magnetic flux concentrator, and carrying out etching and creating a through hole on the passivation layer above the positions corresponding to the bottom electrode and the top electrode, to form a bonding pad for external connection on top of a substrate.

Preferably, before the step 1), the method further includes:

01) depositing and patterning a reset coil conductor on a wafer surface, and depositing a first insulation layer on the surface of the reset coil conductor; and the step 1) is depositing a stacked layer of thin-film materials of magnetoresistive sensing units on the surface of the first insulation layer, and setting pinning layer magnetization directions of the thin-film materials of magnetoresistive sensing units.

Preferably, the step 5) further includes:

depositing and patterning a test coil conductor above the third insulation layer; and the step 7) is: depositing a passivation layer above the soft magnetic flux concentrator, and then carrying out etching and creating a through hole on the passivation layer above the positions corresponding to the bottom electrode and the top electrode as well as the reset coil and the test coil electrode, to form a bonding pad for external connection.

The present invention further provides another preparation method of a single-chip differential free layer push-pull magnetic field sensor bridge, the method including the following steps:

1) forming a deep TSV hole on a substrate by a DRIE process;

2) electroplating a TSV Cu pillar in the deep hole;

3) flattening the electroplated TSV Cu pillar higher than the surface of the substrate;

4) depositing a stacked layer of magnetoresistive thin-film materials on the substrate, such that the electrode position is connected to the TSV Cu pillar of an etched window, and setting pinning layer magnetization directions of the magnetoresistive thin-film materials;

5) establishing a bottom electrode, and establishing patterns of magnetoresistive sensing units on the magnetoresistive thin-film materials by using a first relevant process;

6) depositing a second insulation layer above the magnetoresistive sensing units, and forming a through hole for electrically interconnecting the magnetoresistive sensing units through a second relevant process;

7) depositing a top metal layer above the through hole, forming a top electrode through the first relevant process, and wiring among the magnetoresistive sensing units;

8) depositing a third insulation layer above the top metal layer;

9) depositing a soft magnetic flux concentrator above the third insulation layer;

10) depositing a passivation layer above the soft magnetic flux concentrator;

11) thinning the back of the substrate, to expose the TSV Cu pillar; and 12) forming a TSV bonding pad on the bottom of the substrate, and connecting the TSV bonding pad to the TSV Cu pillar.

Preferably, between steps 3) and 4), the method further includes: depositing and patterning a reset coil conductor on the substrate, such that output and input ends of an electrode thereof are connected to the Cu pillar, and depositing a first insulation layer on the surface of the reset coil conductor; and step 4) is:

etching a window of the first insulation layer, and depositing a stacked layer of the magnetoresistive thin-film materials on the substrate on the surface of the first insulation layer, such that the electrode position is connected to the TSV Cu pillar of the etched window, and setting pinning layer magnetization directions of the magnetoresistive thin-film materials.

Preferably, the step 8) is depositing a third insulation layer above the top metal layer, opening a window of the third insulation layer, and depositing and patterning the test coil conductor above the third insulation layer, such that output and input electrodes thereof are connected to the TSV Cu pillar.

Preferably, the insulation layer is made of aluminum oxide, silicon nitride, silicon oxide, polyimide or photoresist.

Preferably, the passivation layer is made of diamond-like carbon, silicon nitride, aluminum oxide or gold.

Preferably, the magnetization directions of the pinning layers of the magnetoresistive thin-film materials are set through high temperature annealing in a magnetic field.

Preferably, the first relevant process includes photoetching, ion etching, reactive ion etching, wet etching, stripping or hard masking.

Preferably, the second relevant process includes photoetching, ion etching, reactive ion etching or wet etching.

Preferably, the through hole is a self-aligned contact hole, and the self-aligned contact hole is formed by stripping the magnetoresistive thin-film materials, and is formed by using an ion etching process or by using hard masking and a chemical mechanical polishing process.

BRIEF DESCRIPTION OF THE DRAWINGS

FIG. 1 is a structural diagram of a push-pull magnetoresistive sensor bridge;

FIGS. 2a and 2b are diagrams of magnetization states of differential free layer and flipped pinning layer push-pull magnetoresistive sensors respectively;

DETAILED DESCRIPTION

The present invention is described below in detail with reference to the accompanying drawings and in combination with embodiments.

Embodiment 1

FIG. 1 is a full-bridge structural diagram of a push-pull magnetoresistive sensor, which includes four bridge arms R1, R2, R3 and R4, wherein R1 and R4 are push arms, and R2 and R3 are pull arms. For the magnetoresistive sensor, the push arms and the pull arms have opposite magnetic field change features under the action of an external magnetic field, and for GMR spin valves and TMR type magnetoresistive sensing units, it means that included angles between freelayer magnetization directions and pinning layers increase (decrease) and decrease (increase) respectively and vary identically in amplitude.

FIGS. 2a and 2b show two possible situations of a magnetization state in a GMR spin valve or a TMR type push-pull magnetoresistive sensor. FIG. 2b shows a situation of a flipped pinning layer, wherein pinning layer magnetization directions in push-arm magnetoresistive sensing units and pull-arm magnetoresistive sensing units are opposite, while freelayer magnetization directions are identical. In this way, when an external magnetic field acts, although magnetization directions of their free layers vary identically, as pinning layer magnetization directions are opposite, their variations in an included angle relative to the pinning layer are opposite. The flipped pinning layer in FIG. 2b is the most common push-pull magnetoresistive sensor structure, of which the implementation manner is flipping a chip including push arms by 180 degrees to obtain a chip of pull arms, then connecting the chips through wire-bonds, and jointly packaging them in a same chip.

FIG. 2a shows a situation of a differential free layer proposed in the present invention, wherein pinning layer magnetization directions in push-arm magnetoresistive sensing units and pull-arm magnetoresistive sensing units are identical. However, under the action of a same external magnetic field, with the effect of a magnetic circuit, magnetic field directions of free layers of push arms and pull arms are made opposite, and in this way, under the action of the same external magnetic field, included angles between the magnetization directions of the free layers and the magnetization directions of the pinning layers also vary reversely. As magnetization states of the pinning layers and the free layers in the push-arm magnetoresistive sensing units and the pull-arm magnetoresistive sensing units are identical, the push-arm magnetoresistive sensing units and the pull-arm magnetoresistive sensing units can be integrated on a same chip.

Embodiment 2

Figure 3:
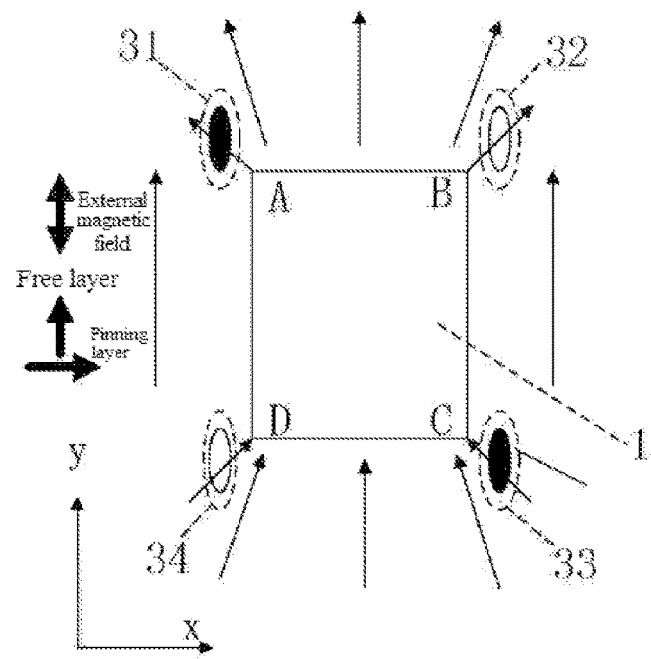
FIG. 3 is a diagram of Y-direction magnetic field distribution features of soft magnetic flux concentrators and relative positions of magnetoresistive sensing units.

FIG. 3 is a diagram of magnetic field distribution of magnetic fields having two opposite X components converted from a same Y-direction measurement external magnetic field H by using a soft magnetic flux concentrator proposed in the present invention and positions of corresponding push magnetoresistive sensing units and pull magnetoresistive sensing units. The soft magnetic flux concentrator 1 has sides parallel to X and Y axes, and has four corners which are sequentially labeled as A, B, C and D clockwise from an upper left position. After the Y-direction external magnetic field H passes through the flux concentrator 1, the magnetic field is distorted near the flux concentrator 1, and in addition to Y magnetic field components, X magnetic field components are also present, wherein magnetic fields near the corner position D and the corner position B have positive X magnetic field components, magnetic fields near the corner position A and the corner position C have negative X magnetic field components, and thus magnetoresistive sensing units 31 and 33 near the positions of the corner A and the corner C are defined as push magnetoresistive sensing units, magnetoresistive sensing units 32 and 34 near the positions of the corner B and the corner D are defined as pull magnetoresistive sensing units, directions of pinning layers of the four magnetoresistive sensing units, i.e., 31, 32, 33 and 34, are the X direction, and freelayer magnetization directions are the Y direction. The embodiment of the present application discloses a single-chip differential free layer push-pull magnetic field sensor bridge, including:

a substrate on an X-Y plane; a staggered soft magnetic flux concentrator array, wherein each soft magnetic flux concentrator has sides parallel to an X-axis and a Y-axis, and four corners sequentially labeled as A, B, C and D; and a magnetoresistive sensing unit array on the substrate, including magnetoresistive sensing units located at gaps between the soft magnetic flux concentrators; wherein the magnetoresistive sensing units near the A and C corner positions of the soft magnetic flux concentrators are referred to as push magnetoresistive sensing units; the magnetoresistive sensing units near the B and D corner positions of the soft magnetic flux concentrators are referred to as pull magnetoresistive sensing units; all the push magnetoresistive sensing units are electrically interconnected into one or more push arms; all the pull magnetoresistive sensing units are electrically interconnected into one or more pull arms; and all the push arms and all the pull arms are electrically interconnected to form a push-pull sensor bridge.

The staggered soft magnetic flux concentrator array consists of two soft magnetic flux concentrator arrays, and soft magnetic flux concentrators of the two soft magnetic flux concentrator arrays are staggered, so that a magnetic flux loop can be formed between the soft magnetic flux concentrators of the two soft magnetic flux concentrator arrays. Several specific structures are provided in the following.

Embodiment 3

Figure 4:
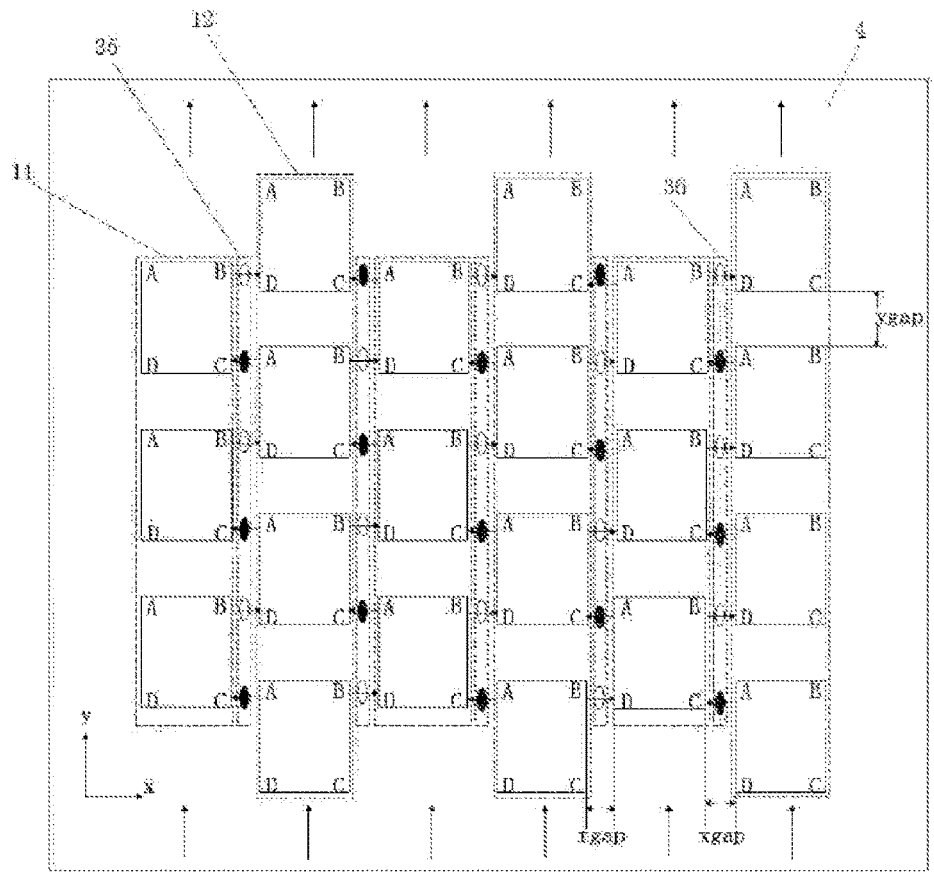
FIG. 4 is a diagram of Y-direction magnetic field measurement of a single-chip differential free layer push-pull magnetoresistive sensor.
Figure 5:
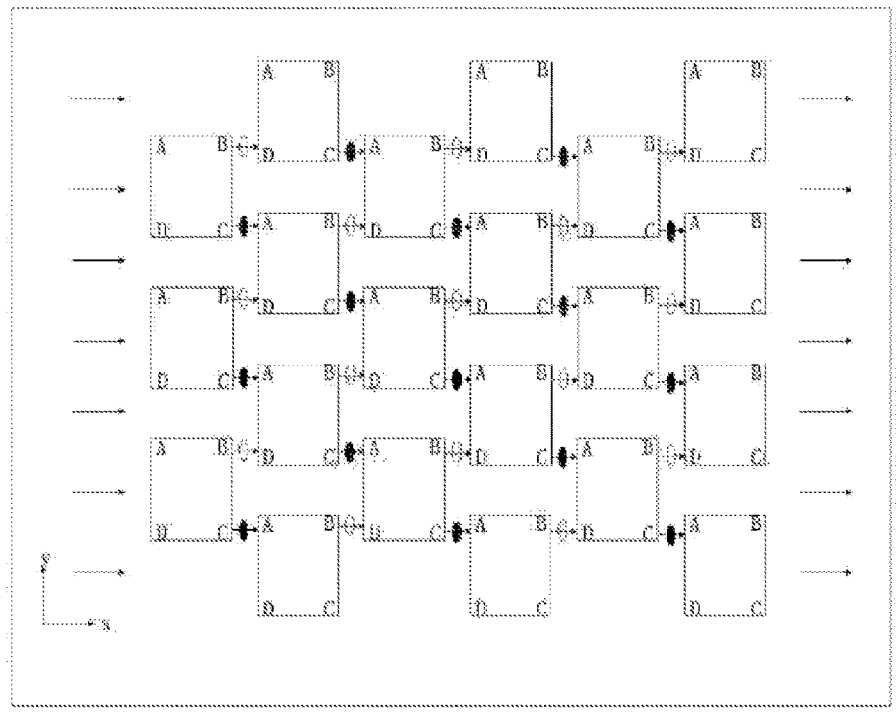
FIG. 5 is a diagram of X-direction magnetic field measurement of the single-chip differential free layer push-pull magnetoresistive sensor.

FIG. 4 and FIG. 5 are a structural diagram of a single-chip differential free layer push-pull magnetoresistive sensor proposed in the present invention and a diagram of a measurement principle of external magnetic fields in X and Y directions, which includes a substrate on an X-Y plane, a soft magnetic flux concentrator array formed by first and second soft magnetic flux concentrator arrays, i.e., 11 and 12, in a staggered manner, and a magnetoresistive sensor array 35 formed by push magnetoresistive sensing units and pull magnetoresistive sensing units. A row direction of the soft magnetic flux concentrator array is parallel to an X axis, a column direction thereof is parallel to a Y axis, a Y-direction gap thereof is ygap, an X-direction gap is xgap and rgap, that is, along a positive X direction, an X-direction gap between a first column of the first soft magnetic flux concentrators and a first column of the second soft magnetic flux concentrators adjacent thereto is xgap, while an X-direction gap between a first column of the second soft magnetic flux concentrators and a second column of the first soft magnetic flux concentrators is rgap. In this embodiment, xgap and rgap have the same value. The dimension of the soft magnetic flux concentrators is Ly in the Y direction and is Lx in the X direction, wherein columns of the soft magnetic flux concentrators 11 and 12 move relatively along the Y direction by a distance of positive or negative (Ly+ygap)/2. The magnetoresistive sensor array 35 is located at gaps between the soft magnetic flux concentrators 11 and 12, of which the row direction is parallel to the X direction and the column direction is parallel to the Y direction, wherein the push magnetoresistive sensing units are located near the corner A and the corner C at the same time, and the pull magnetoresistive sensing units are located near the corner B and the corner D at the same time. The push magnetoresistive sensing units are electrically interconnected into one or more push arms, the pull magnetoresistive sensing units are electrically interconnected into one or more pull arms, and the push arms and the pull arms are electrically interconnected to form a push-pull magnetoresistive sensor bridge.

In the above structure, B and C of the soft magnetic flux concentrator in the first column and the first row and D and A of the soft magnetic flux concentrators in the second column and the first and second rows form a continuous magnetic flux path.

FIG. 4 also gives a direction of a magnetic field component in a sensitive direction at the position of the magnetoresistive sensor under the action of the Y-direction magnetic field. According to FIG. 2a, directions of free layers of the push magnetoresistive sensing units and the pull magnetoresistive sensing units have opposite magnetic field directions relative to the directions of their pinning layers, indicating that effective measurement can be carried out on the Y-direction magnetic field.

FIG. 5 shows a direction of a magnetic field component in a magnetic field sensing axis at the position of the magnetoresistive sensor under the action of the X-direction magnetic field. It can be seen according to FIG. 2a that directions of free layers of the push magnetoresistive sensing units and the pull magnetoresistive sensing units have identical magnetic field directions relative to the directions of their pinning layers. At this point, the push arms and the pull arms have identical resistance variation, and thus output of the push-pull magnetoresistive sensor bridge is 0. Therefore, FIG. 4 and FIG. 5 indicate that the magnetic field sensitive direction of the single-chip differential free layer push-pull magnetoresistive sensor is Y direction, and the single-chip differential free layer push-pull magnetoresistive sensor is a Y-axis magnetic field sensor.

Embodiment 4

Figure 6:
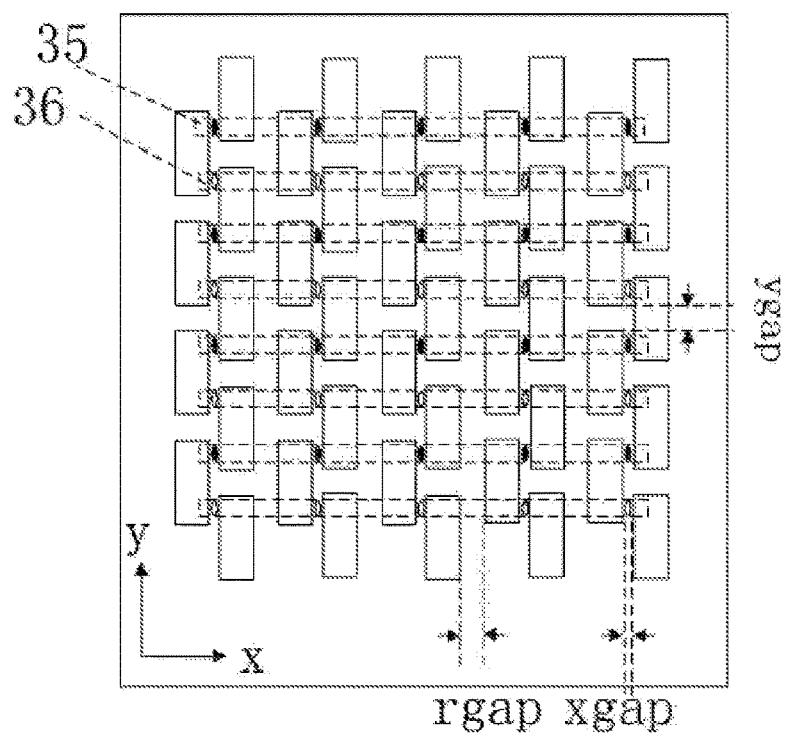
FIG. 6 is a diagram of a first structure of the single-chip differential free layer push-pull magnetoresistive sensor.

FIG. 6 is a diagram of a first structure of the single-chip differential free layer push-pull magnetoresistive sensor, which is actually a special example in FIG. 4 and FIG. 5, characterized in that, each column of the magnetoresistive sensor in the Y direction is composed of push magnetoresistive sensing units and pull magnetoresistive sensing units arranged alternately, while each row in the X direction is completely composed of push magnetoresistive sensing units or pull magnetoresistive sensing units, and push magnetoresistive rows 35 and pull magnetoresistive rows 36 are arranged alternately. At this point, xgap and rgap may be different. In this embodiment, xgap is less than rgap, to ensure that magnetic fields are concentrated as much as possible at the xgap where the magnetoresistive sensing units are located.

Embodiment 5

Figure 7:
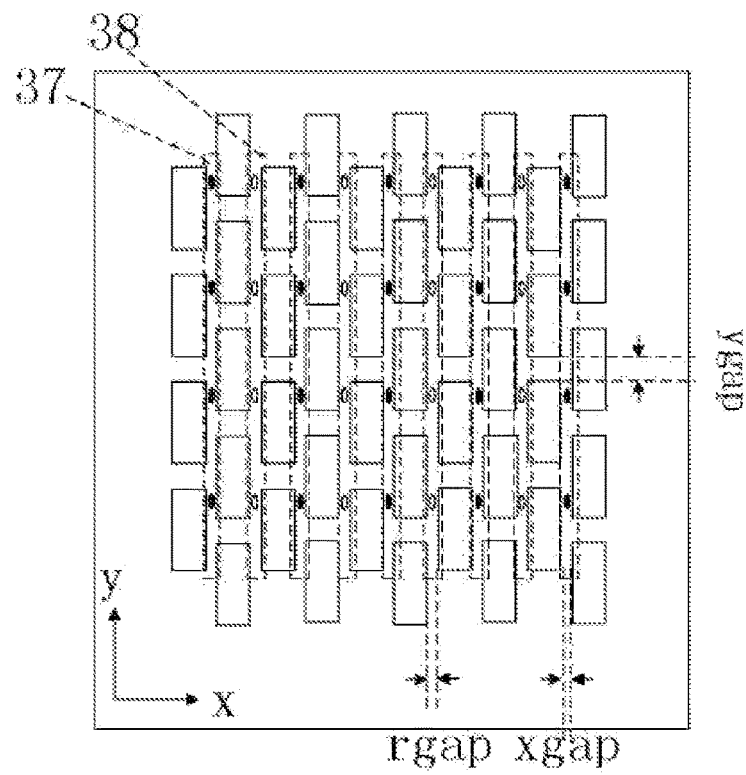
FIG. 7 is a diagram of a second structure of the single-chip differential free layer push-pull magnetoresistive sensor.

FIG. 7 is a diagram of a second structure of the single-chip differential free layer push-pull magnetoresistive sensor, which is actually also another special example in FIG. 4 and FIG. 5, characterized in that, each row of the magnetoresistive sensor in the X direction is composed of push magnetoresistive sensing units and pull magnetoresistive sensing units arranged alternately, while each column in the Y direction is completely composed of push magnetoresistive sensing units or pull magnetoresistive sensing units, and push magnetoresistive sensing unit columns 37 and pull magnetoresistive sensing unit columns 38 are arranged alternately. At this point, xgap is equal to rgap, to ensure that the magnetoresistive sensor rows have identical magnetic field intensity.

Embodiment 6

Figure 8:
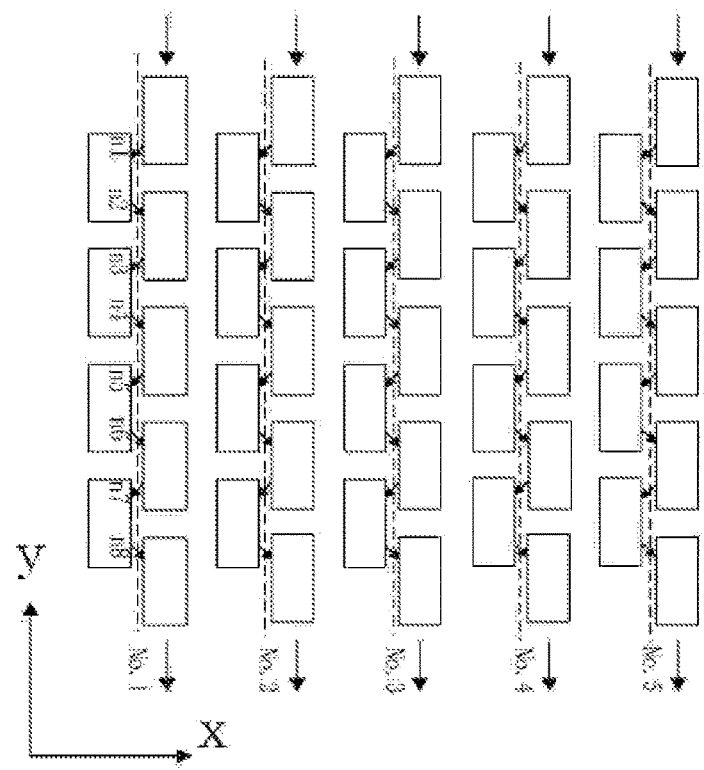
FIG. 8 is a diagram of Y-direction magnetic field measurement of the first structure of the single-chip differential free layer push-pull magnetoresistive sensor.
Figure 10:
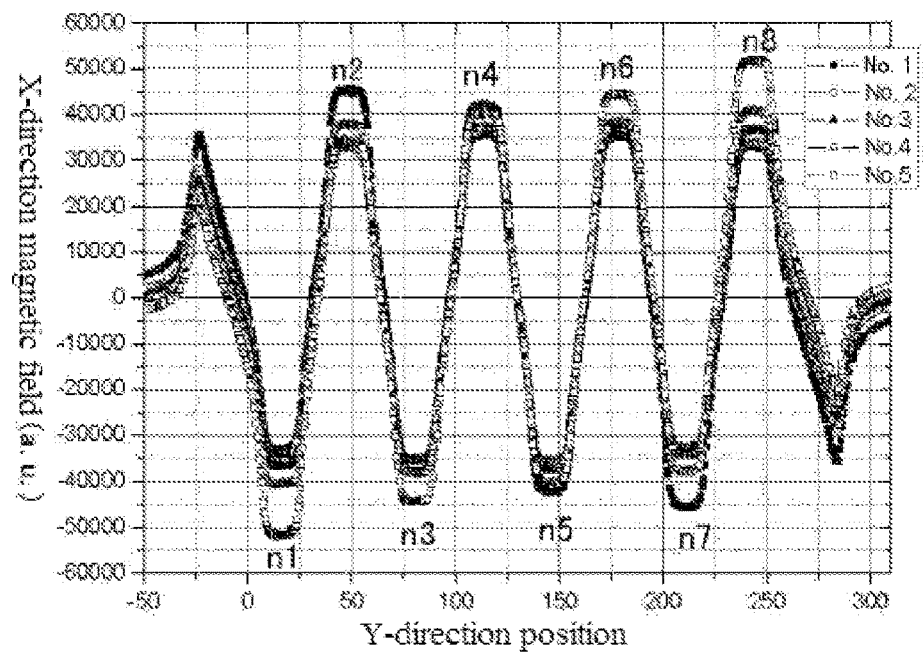
FIG. 10 is a diagram of Y-direction magnetic field distribution of sensor positions of the first structure of the single-chip differential free layer push-pull magnetoresistive sensor.

FIG. 8 and FIG. 10 are diagrams of distribution of X-direction magnetic field components of columns No. 1 to No. 5 of the magnetoresistive sensor array along the Y direction when the single-chip differential free layer push-pull magnetic field sensor tests Y magnetic fields, in which n1-n8 are respectively corresponding to 8 magnetoresistive sensing units in each row, including 4 push magnetoresistive sensing units and 4 pull magnetoresistive sensing units. It can be seen from FIG. 10 that there are opposite X-direction magnetic field directions in the positions where the push magnetoresistive sensing units and the pull magnetoresistive sensing units are located, and in addition, amplitudes are almost the same, thus forming a push-pull bridge.

Figure 9:
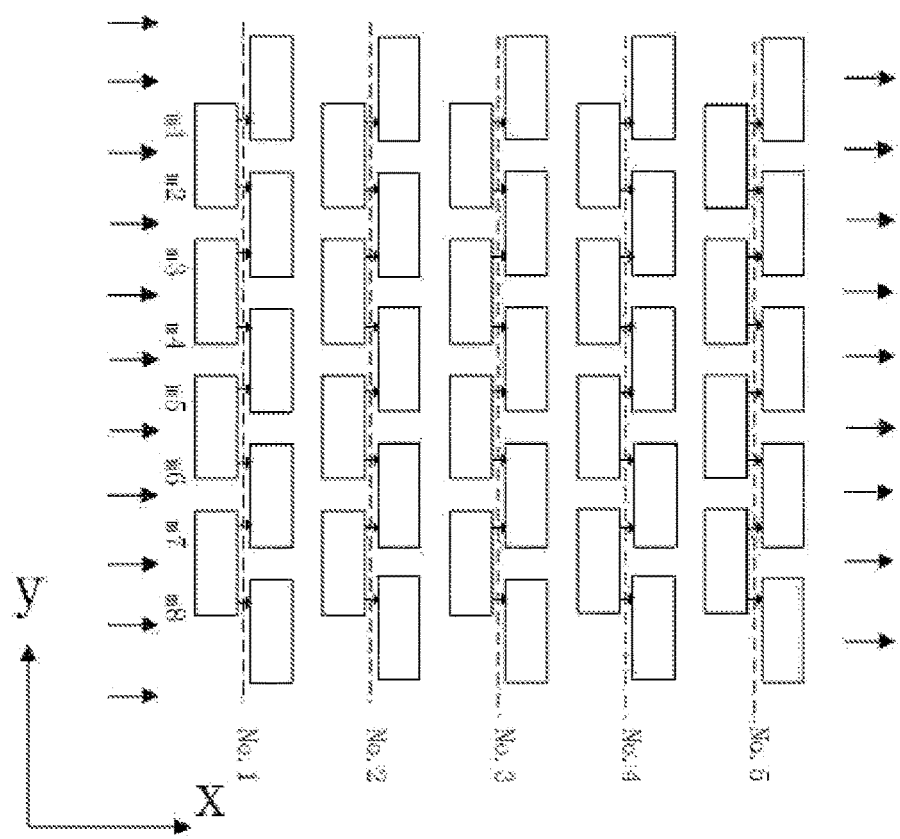
FIG. 9 is a diagram of X-direction magnetic field measurement of the first structure of the single-chip differential free layer push-pull magnetoresistive sensor.
Figure 11:
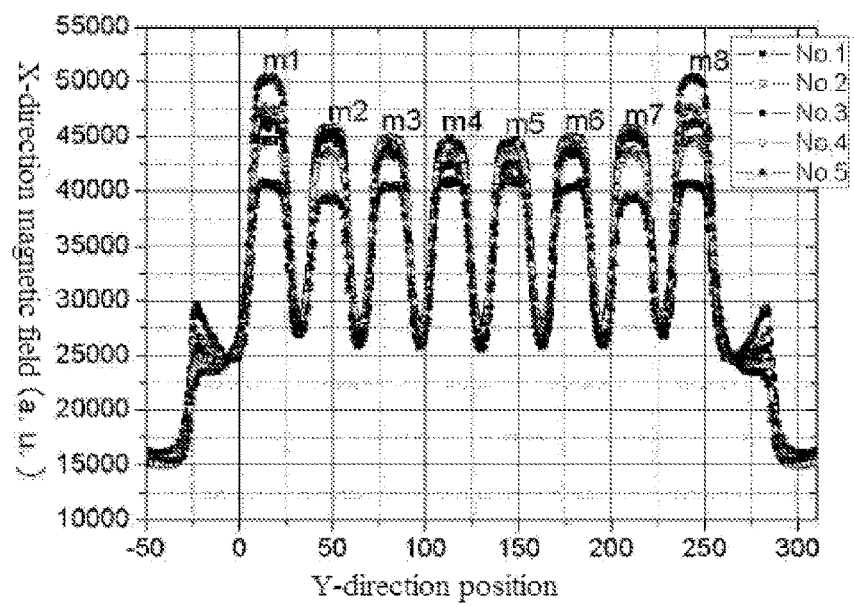
FIG. 11 is a diagram of X-direction magnetic field distribution of sensor positions of the first structure of the single-chip differential free layer push-pull magnetoresistive sensor.

FIG. 9 and FIG. 11 are diagrams of distribution of X-direction magnetic field components of rows No. 1 to No. 5 of the magnetoresistive sensor array along the Y direction when the single-chip differential free layer push-pull magnetic field sensor tests X magnetic fields. It can be seen from FIG. 11 that corresponding magnetoresistive sensing units m1-m8 in each row have identical X-direction magnetic field directions, indicating that the bridge of this structure may not respond to the X-direction magnetic fields.

Embodiment 7

Figure 12:
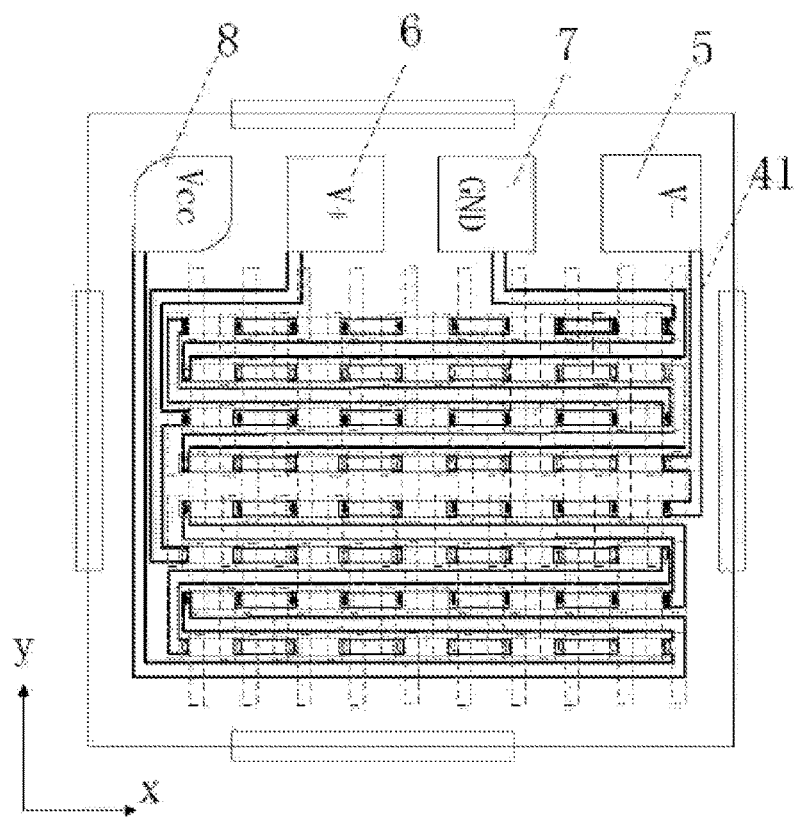
FIG. 12 is a diagram of bridge connection of the first structure of the single-chip differential free layer push-pull magnetoresistive sensor.

FIG. 12 is a diagram of electrical connection of the single-chip differential free layer push-pull magnetoresistive sensor corresponding to the first structure, from which it can be seen that the push magnetoresistive sensing units and the pull magnetoresistive sensing units are electrically interconnected into push arms and pull arms, the push arms and the pull arms are electrically interconnected to form a push-pull magnetoresistive sensor bridge of a full-bridge structure through conductor metal 41, and are respectively connected to a bias electrode 8, a ground electrode 7 and output and input electrodes 5 and 6. The push-pull bridge, in addition to the full bridge, may also be of the type of a half bridge or a quasi bridge.

Embodiment 8

Figure 13:
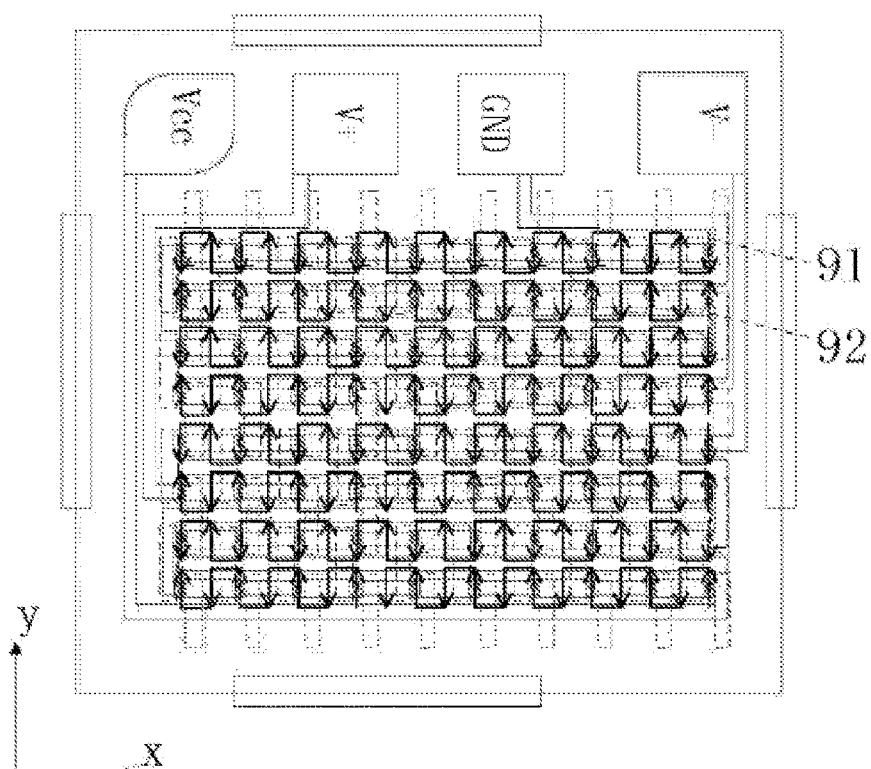
FIG. 13 is a diagram of arrangement of test coils of the first structure of the single-chip differential free layer push-pull magnetoresistive sensor.

FIG. 13 is a diagram of distribution of test coils on a chip in a situation that the single-chip differential free layer push-pull magnetic field sensor includes the test coils, wherein the test coils include two segments 91 and 92, and are respectively located on the push magnetoresistive sensing units and the pull magnetoresistive sensing units, the current flowing directions are the Y direction and are opposite. The test coils are in a zigzag geometrical shape, to ensure that test coil segments flowing above the push magnetoresistive sensing units are parallel and that test coil segments flowing above the pull magnetoresistive sensing units are also parallel to each other. When current passes through the test coils, as current in the segment 91 and current in the segment 92 are identical in magnitude and opposite in direction, the segment 91 generates an X-direction magnetic field H1 at the push magnetoresistive sensing unit, the segment 92 generates an -X-direction magnetic field -H1 at the pull magnetoresistive sensing unit, which are of the same magnitude, and the magnitude of the magnetic fields is directly proportional to the current I flowing therethrough. In this way, employing the current I flowing through the test coils can simulate a magnetic field generated by an external magnetic field at the push magnetoresistive sensing units and the pull magnetoresistive sensing units through soft magnetic flux concentrators in a situation where the external magnetic field is along the Y direction. In this way, the single-chip differential free layer push-pull magnetic field sensor can be calibrated through the test coils, that is, through certain current. In this case, changes of signals at output ends of a chip are measured directly, if an output voltage is within a certain range, the chip is a normal available chip, and if the output voltage is not within the range, the chip is a defective chip.

Embodiment 9

Figure 14:
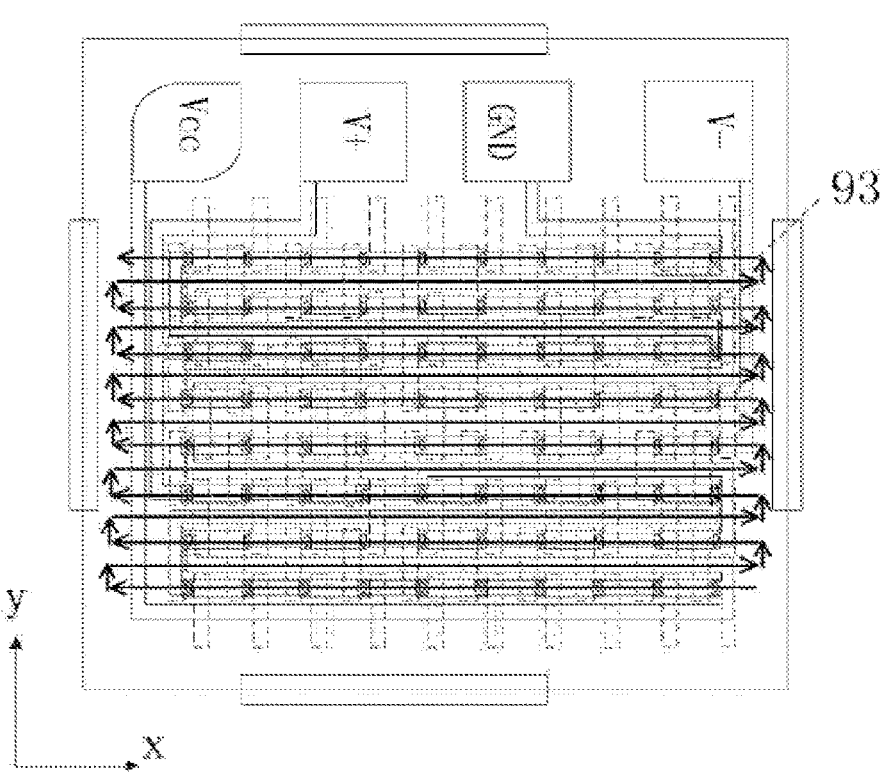
FIG. 14 is a diagram of arrangement of reset coils of the first structure of the single-chip differential free layer push-pull magnetoresistive sensor.

FIG. 14 is a diagram of distribution of reset coils 93 on a chip in a situation that the single-chip differential free layer push-pull magnetic field sensor includes the reset coils 93, from which it can be seen that the reset coils 93 are in a zigzag shape, including straight-line segments respectively passing above columns formed by push magnetoresistive sensing units and pull magnetoresistive sensing units, the straight-line segments being parallel to the X direction and having identical current directions. The purpose of the reset coils 93 is as follows: when the single-chip differential free layer push-pull magnetic field sensor is placed in a strong magnetic field, due to the irreversible domain wall movement process, which occurs in a magnetization process, of a magnetic domain included in free layers, the free layers have great magnetic hysteresis under the action of the external magnetic field, and deviate from the original standard test curve. In this case, magnetic fields generated at the push magnetoresistive sensing units and the pull magnetoresistive sensing units by magnetic field directions of current produced by the reset coils 93 are in the Y direction. At this point, as pinning layer magnetization directions are the X direction, freelayer magnetization directions are Y direction, by adjusting periodic changes of the current in the reset coils and periodic changes of Y magnetic fields generated, the magnetization directions and magnetization states of the free layers are adjusted to reasonable states, such that the single-chip differential free layer push-pull magnetic field sensor resumes normal operation.

Embodiment 10

Figure 15:
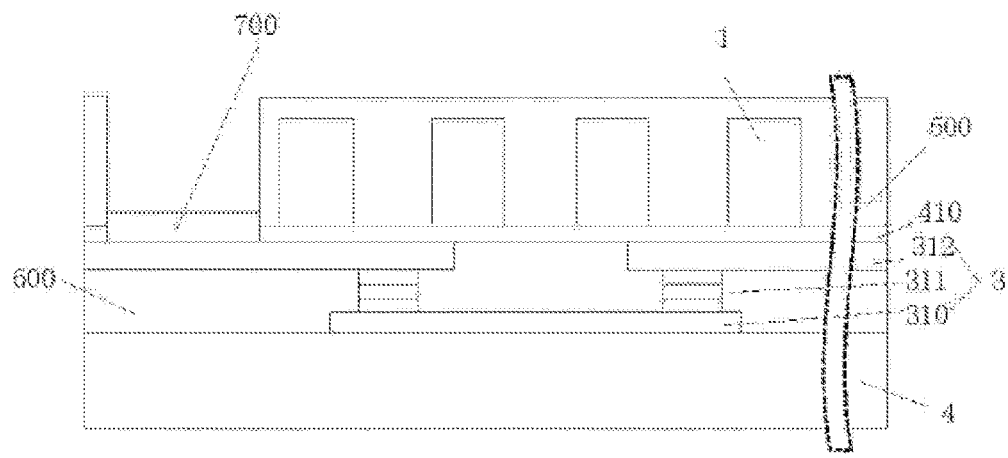
FIG. 15 is a structural diagram of respective layers of the single-chip differential free layer push-pull magnetoresistive sensor.
Figure 16:
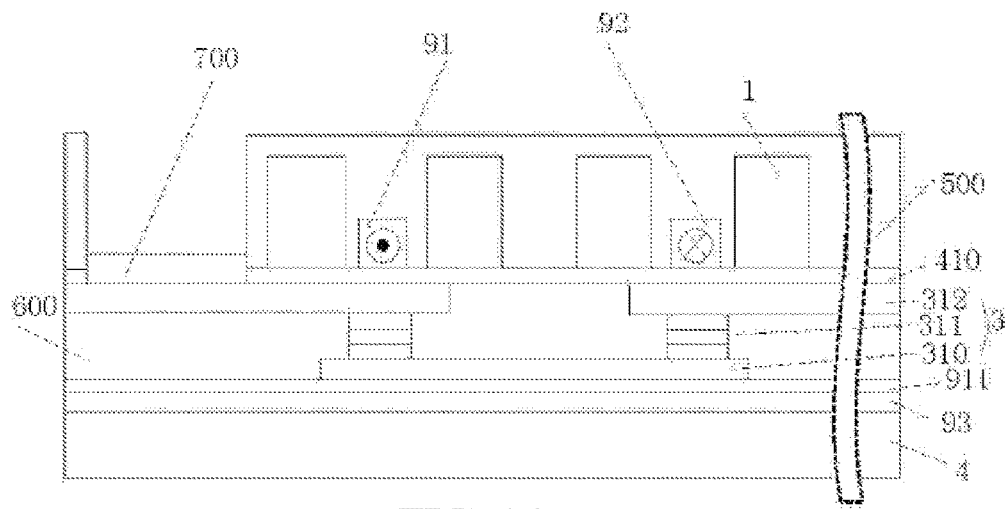
FIG. 16 is a structural diagram of respective layers of a single-chip differential free layer push-pull magnetoresistive sensor with test coils and reset coils.

FIG. 15 and FIG. 16 are respectively sectional diagrams of a chip in the case that the single-chip differential free layer push-pull magnetic field sensor does not include and includes test coils and reset coils. In FIG. 15, the chip includes sequentially, from bottom to top, a substrate 4, a magnetoresistive sensor 3 located on the substrate 4, including a seed layer and a bottom conductive electrode 310, a multi-layer thin-film material stacked layer 311, an insulation layer 600 into which the multi-layer thin-film material stacked layer 311 is embedded, and a top conductive electrode 312; in addition, an insulation layer 410 located between the top conductive electrode 312 and a soft magnetic flux concentrator 1; in addition, a passivation layer 500 located above the top electrode 312 and above the soft magnetic flux concentrator 1, and a bonding pad 700 located above a top electrode layer 410.

FIG. 16 is different from FIG. 15 in that the reset coils 93 are located on the substrate 4, and the reset coils 93 and the bottom electrode 310 are isolated by using an insulation layer 911. In addition, the test coils include 91 and 92 located above the magnetoresistive sensing units 3, which have opposite current directions respectively.

Figure 17:
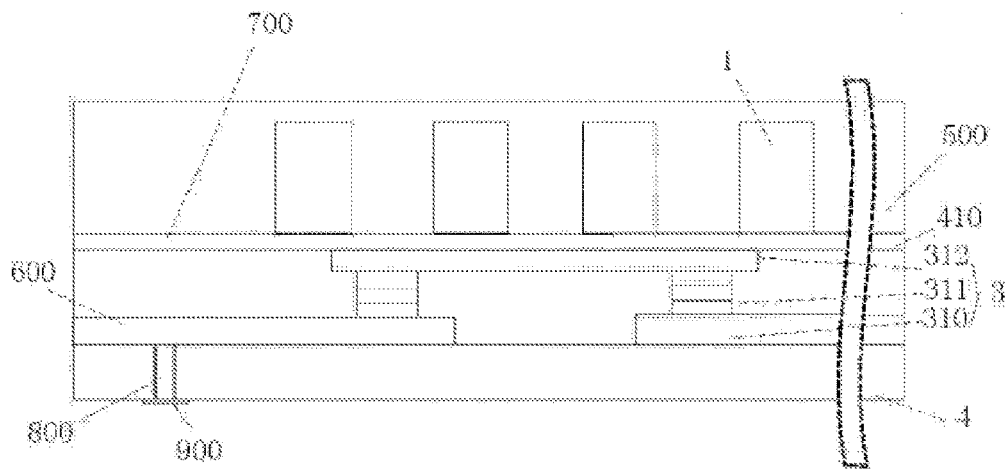
FIG. 17 is a structural diagram of respective layers of a TSV single-chip differential free layer push-pull magnetoresistive sensor.
Figure 18:
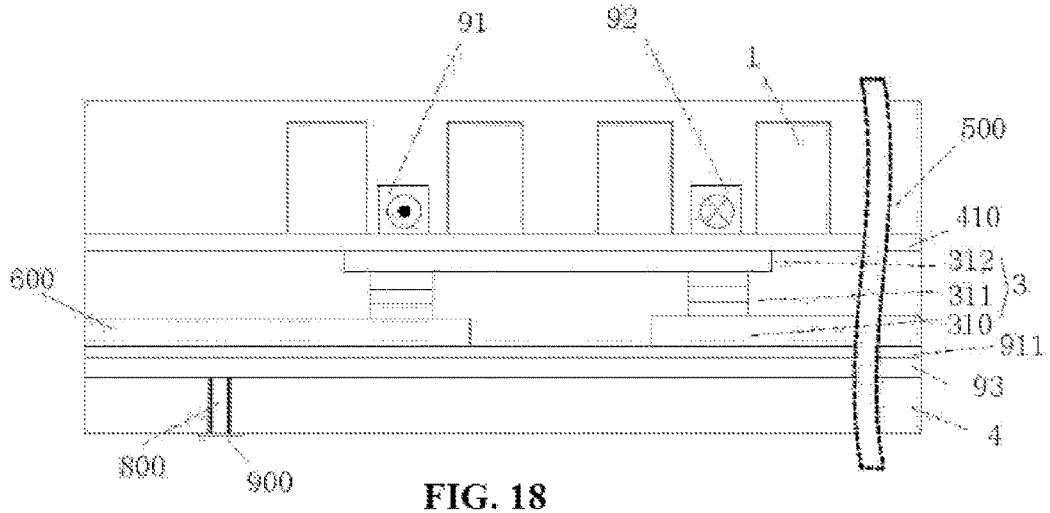
FIG. 18 is a structural diagram of respective layers of a TSV single-chip differential free layer push-pull magnetoresistive sensor with test coils and reset coils.

The above is the form of using a front bonding pad of a chip, but actually, a situation where a Through Silicon Vias (TSV) back bonding pad is used is further included, as shown in FIG. 17 and FIG. 18, and the difference lies in that a TSV Cu pillar 800 and a bonding pad 900 on the bottom of the substrate 4 are included.

Embodiment 11

Figure 19:
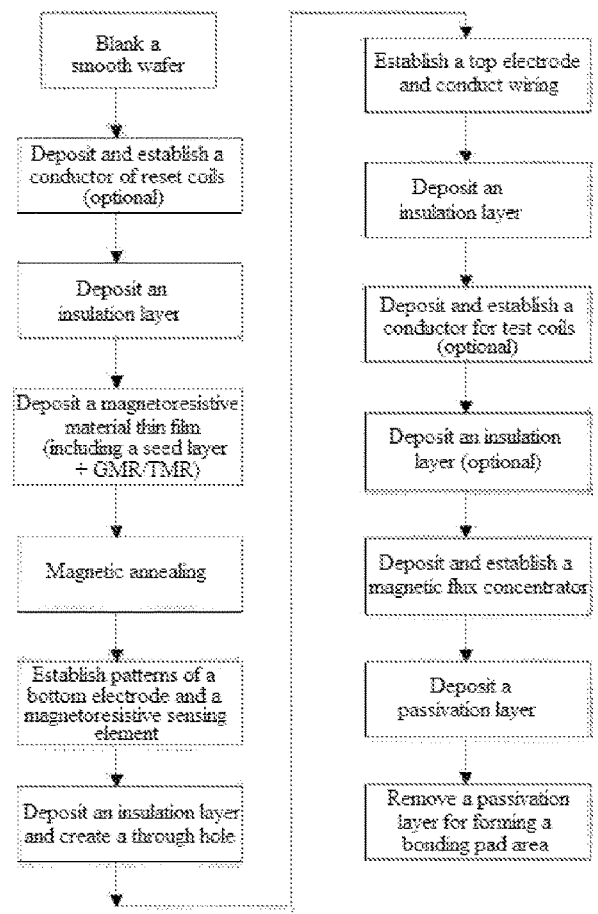
FIG. 19 is a diagram of a micro-manufacturing process of the single-chip differential free layer push-pull magnetoresistive sensor.

FIG. 19 is a diagram of a manufacturing process of a single-chip differential free layer push-pull magnetic field sensor corresponding to the situation that the bonding pad is located on top of the chip, including the following steps:

1) smoothing a blank wafer 4;
2) depositing and establishing a reset coil conductor 93 on the surface of the wafer;
3) depositing a first insulation layer 911 on the surface of the reset coil conductor;
4) depositing a seed layer, a bottom electrode 310 and a magnetoresistive multi-layer thin-film material stacked layer 311 on the surface of the first insulation layer;
5) carrying out magnetic annealing to obtain pinning layer magnetization directions of magnetoresistive multi-layer thin-film materials;
6) establishing patterns of the bottom electrode 310 and the magnetoresistive sensing units 311 by using a relevant process;
7) depositing a second insulation layer 600 above the magnetoresistive sensing units, and creating a through hole in the second insulation layer 600 by using a particular process, to expose the magnetoresistive multi-layer thin-film material stacked layer corresponding to a top electrode;
8) establishing a top electrode 312 and wiring;
9) depositing a third insulation layer 410 above the top electrode;
10) depositing and establishing test coil conductors 91 and 92 above the third insulation layer;
11) depositing and establishing a soft magnetic flux concentrator 1 above the third insulation layer;
12) depositing a passivation layer 500 above the soft magnetic flux concentrator; and
13) removing the passivation layer for forming a bonding pad area by using a particular machining process, and forming a bonding pad 700.

Figure 20:
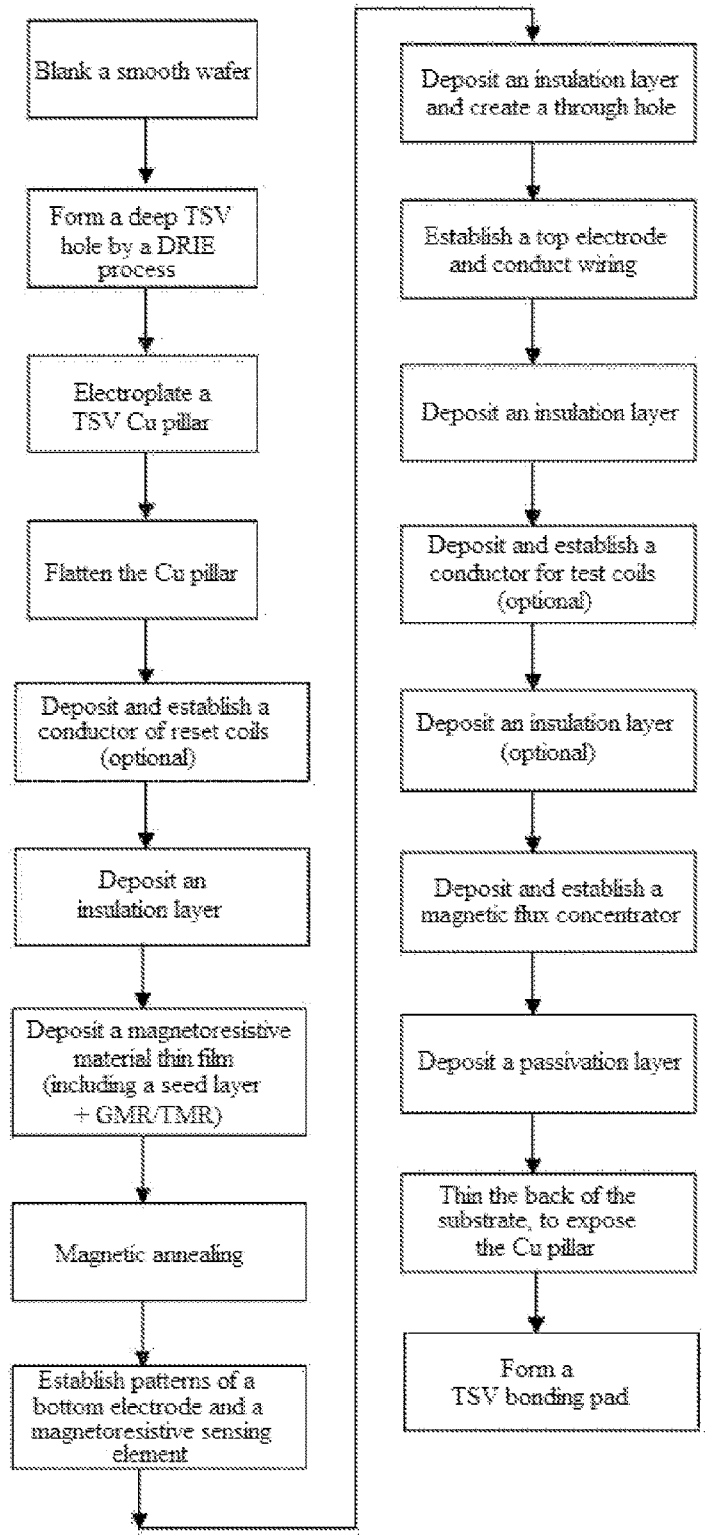
FIG. 20 is a diagram of a micro-manufacturing process of the TSV single-chip differential free layer push-pull magnetoresistive sensor.

When the bonding pad is located on the bottom of the substrate by using a TSV process, the machining steps as shown in FIG. 20 are employed:

1) forming a deep TSV hole on the substrate 4 by using a DRIE process;
2) electroplating a TSV Cu pillar 800 in the deep TSV hole;
3) smoothing the electroplated TSV Cu pillar 800 higher than the surface of the substrate;
4) depositing and patterning the reset coil conductor 93, such that output and input ends of an electrode thereof are connected to the TSV Cu pillar 800 (optional);
5) depositing a first insulation layer 911 on the surface of the reset coil conductor 93 (optional);
6) etching a window of the first insulation layer 911, and depositing a stacked layer of magnetoresistive thin-film materials 311 on the surface of the first insulation layer 911, such that the position of a bottom electrode 310 is connected to the Cu pillar 800 of the etched window, and setting pinning layer magnetization directions of the magnetoresistive thin-film materials 311;
7) establishing the bottom electrode 310, and establishing patterns of magnetoresistive sensing units on the magnetoresistive thin-film materials 311 by using a relevant process;
8) depositing a second insulation layer 600 above the magnetoresistive sensing units, and forming a through hole electrically interconnected to the magnetoresistive sensing units 311 through a relevant process;
9) depositing a top metal layer 312 above the through hole, forming a top electrode through a relevant process, and wiring among the magnetoresistive sensing units;
10) depositing a third insulation layer 410 above the top metal layer 312, opening an insulation layer window, and then depositing and patterning test coil conductors 91 and 92 above the third insulation layer, such that input and output electrodes thereof are connected to the Cu pillar 800 (optional);
11) depositing a soft magnetic flux concentrator 1 above the third insulation layer 410;

12) depositing a passivation layer 500 above the soft magnetic flux concentrator 1;

13) thinning the back of the substrate 4, to expose the Cu pillar 800; and 14) forming a TSV bonding pad 900, and connecting the TSV bonding pad to the TSV Cu pillar 800.

An insulating material for depositing the insulation layer may be aluminum oxide, silicon nitride, silicon oxide, polyimide and photoresist.

The material for forming the passivation layer is DLC, silicon nitride, aluminum oxide and gold.

The magnetization directions of the pinning layers in the magnetoresistive thin-film materials are set through high temperature annealing in a magnetic field.

The relevant process in the steps includes photoetching, ion etching, reactive ion etching, wet etching, stripping, or hard masking.

The through hole in the steps is a self-aligned contact hole, and the self-aligned contact hole is formed by stripping the magnetoresistive thin-film materials, and is formed by using an ion etching process or by using hard masking and a chemical mechanical polishing process.

The invention claimed is:

1. A single-chip differential free layer push-pull magnetic field sensor bridge, comprising:
    a substrate on an X-Y plane;
    a staggered soft magnetic flux concentrator array, wherein each soft magnetic flux concentrator has sides parallel to an X-axis and a Y-axis, and four corners sequentially labeled as A, B, C and D clockwise from an upper left position; and
    a magnetoresistive sensing unit array on the substrate, comprising magnetoresistive sensing units located at gaps between the soft magnetic flux concentrators;
    wherein the magnetoresistive sensing units near the A and C corner positions of the soft magnetic flux concentrators are referred to as push magnetoresistive sensing units;
    the magnetoresistive sensing units near the B and D corner positions of the soft magnetic flux concentrators are referred to as pull magnetoresistive sensing units;
    all the push magnetoresistive sensing units are electrically interconnected into one or more push arms;
    all the pull magnetoresistive sensing units are electrically interconnected into one or more pull arms; and
    all the push arms and all the pull arms are electrically interconnected to form a push-pull sensor bridge.

2. The single-chip differential free layer push-pull magnetic field sensor bridge according to claim 1, wherein the magnetoresistive sensing units are GMR spin valves or TMR sensing units, and in the absence of an external magnetic field, pinning layer magnetization directions of all the magnetoresistive sensing units are the same and parallel to a Y-axis direction, and freelayer magnetization directions of all the magnetoresistive sensing units are the same and parallel to an X-axis direction.

3. The single-chip differential free layer push-pull magnetic field sensor bridge according to claim 1, wherein the staggered soft magnetic flux concentrator array comprises first soft magnetic flux concentrators and second soft magnetic flux concentrators, the first soft magnetic flux concentrators and the second soft magnetic flux concentrators are both arranged into columns parallel to the Y-axis direction and into rows parallel to the X-axis direction, the dimension of the soft magnetic flux concentrators is Ly in the Y-axis direction and is Lx in the X-axis direction, a gap between respective adjacent rows of the first soft magnetic flux concentrators and the second soft magnetic flux concentrators along the Y-axis direction is ygap, and a distance at which the columns of the second soft magnetic flux concentrators move along the Y-axis direction relative to the columns of the first soft magnetic flux concentrators is (Ly+ygap)/2.

4. The single-chip differential free layer push-pull magnetic field sensor bridge according to claim 3, wherein a row direction of the magnetoresistive sensing unit array is parallel to the X-axis direction and a column direction thereof is parallel to the Y-axis direction, columns of the magnetoresistive sensing unit array are located at centers of the gaps between the adjacent columns of the first soft magnetic flux concentrators and the second soft magnetic flux concentrators, the push magnetoresistive sensing units are respectively corresponding to the A and C corner positions of the first and second soft magnetic flux concentrators at the same time, the second soft magnetic flux concentrators have a positive Y-axis displacement relative to the first soft magnetic flux concentrators, the pull magnetoresistive sensing units are respectively corresponding to the B and D corner positions of the first and second soft magnetic flux concentrators at the same time, and the second soft magnetic flux concentrators have a negative Y-axis equivalent displacement relative to the first soft magnetic flux concentrators.

5. The single-chip differential free layer push-pull magnetic field sensor bridge according to claim 1, wherein each column and each row of the magnetoresistive sensing unit array are both formed by the push magnetoresistive sensing units and the pull magnetoresistive sensing units arranged alternately.

6. The single-chip differential free layer push-pull magnetic field sensor bridge according to claim 1, wherein each column of the magnetoresistive sensing unit array comprises push magnetoresistive sensing units and pull magnetoresistive sensing units arranged alternately, the magnetoresistive sensing unit array comprises push magnetoresistive sensing unit rows and pull magnetoresistive sensing unit rows arranged alternately, the push magnetoresistive sensing unit rows are formed by the push magnetoresistive sensing units, and the pull magnetoresistive sensing unit rows are formed by the pull magnetoresistive sensing units.

7. The single-chip differential free layer push-pull magnetic field sensor bridge according to claim 1, wherein each row of the magnetoresistive sensing unit array comprises push magnetoresistive sensing units and pull magnetoresistive sensing units arranged alternately, columns of the magnetoresistive sensing unit array are push magnetoresistive sensing unit columns and pull magnetoresistive sensing unit columns arranged alternately, the push magnetoresistive sensing unit columns are formed by the push magnetoresistive sensing units, and the pull magnetoresistive sensing unit columns are formed by the pull magnetoresistive sensing units.

8. The single-chip differential free layer push-pull magnetic field sensor bridge according to claim 1, wherein the bias voltage, the ground, and the signal output end of the push-pull magnetic field sensor bridge are electrically interconnected to a bonding pad on top of the substrate or connected to a bonding pad on the bottom of the substrate through TSV.

9. The single-chip differential free layer push-pull magnetic field sensor bridge according to claim 1, wherein, in the absence of an external magnetic field, the magnetoresistive sensing units make magnetization directions of magnetic free layers of the magnetoresistive sensing units perpendicular to magnetization directions of magnetic pinning layers thereof in at least one manner of permanent magnet biasing, double exchange interaction, and shape anisotropy.

10. The single-chip differential free layer push-pull magnetic field sensor bridge according to claim 1, wherein the number of the magnetoresistive sensing units on the push arms and the number of the magnetoresistive sensing units on the pull arms are the same.

11. The single-chip differential free layer push-pull magnetic field sensor bridge according to claim 1, wherein rotation angles of free layers of the magnetoresistive sensing units on the push arms and the magnetoresistive sensing units on the pull arms relative to magnetization directions of respective pinning layers are the same in amplitude and opposite in direction.

12. The single-chip differential free layer push-pull magnetic field sensor bridge according to claim 1, wherein the push-pull magnetic field sensor bridge is a half bridge, a full bridge or a quasi bridge.

13. The single-chip differential free layer push-pull magnetic field sensor bridge according to claim 1, wherein the substrate is made of glass or a silicon wafer, and the substrate comprises an ASIC chip or the substrate is connected to another ASIC chip.

14. The single-chip differential free layer push-pull magnetic field sensor bridge according to claim 1, wherein the soft magnetic flux concentrator is an alloy soft magnetic material comprising one or more of Fe, Ni, and Co elements.

15. The single-chip differential free layer push-pull magnetic field sensor bridge according to claim 1, further comprising test coils, the test coils being respectively located directly above or directly below the magnetoresistive sensing units, current directions of the test coils being parallel to the Y-axis direction, and during a test, current flowing through the test coils respectively corresponding to the push magnetoresistive sensing units and the pull magnetoresistive sensing units being opposite in direction and identical in magnitude.

16. The single-chip differential free layer push-pull magnetic field sensor bridge according to claim 1, further comprising reset coils, the reset coils being located directly below or directly above the magnetoresistive sensors, current directions of the reset coils being parallel to the X-axis direction, and current flowing through the reset coils respectively corresponding to the push magnetoresistive sensing units and the pull magnetoresistive sensing units being identical in magnitude and identical in direction.

17. A preparation method of a single-chip differential free layer push-pull magnetic field sensor bridge, wherein the method comprises the following steps:
1) depositing a stacked layer of thin-film materials of magnetoresistive sensing units on a wafer surface, and setting pinning layer magnetization directions of the thin-film materials;
2) establishing a bottom electrode, and establishing patterns of the magnetoresistive sensing units on the thin-film materials of the magnetoresistive sensing units by using a first relevant process;
3) depositing a second insulation layer above the magnetoresistive sensing units, and forming a through hole for electrically interconnecting the magnetoresistive sensing units by using a second relevant process;
4) depositing a top metal layer above the through hole, forming a top electrode through the first relevant process, and wiring among the magnetoresistive sensing units;

5) depositing a third insulation layer above the top metal layer;
6) depositing and patterning the soft magnetic flux concentrator above the third insulation layer; and
7) depositing a passivation layer above the soft magnetic flux concentrator, and carrying out etching and creating a through hole on the passivation layer above the positions corresponding to the bottom electrode and the top electrode, to form a bonding pad for external connection on top of a substrate.

18. The preparation method according to claim 17, wherein, before the step 1), the method further comprises:
depositing and patterning a reset coil conductor on a wafer surface, and depositing a first insulation layer on the surface of the reset coil conductor; and
the step 1) is depositing a stacked layer of thin-film materials of magnetoresistive sensing units on the surface of the first insulation layer, and setting pinning layer magnetization directions of the thin-film materials of magnetoresistive sensing units.

19. The preparation method according to claim 17, wherein the step 5) further comprises:
depositing and patterning a test coil conductor above the third insulation layer; and
the step 7) is: depositing a passivation layer above the soft magnetic flux concentrator, and then carrying out etching and creating a through hole on the passivation layer above the positions corresponding to the bottom electrode and the top electrode as well as the reset coil and the test coil electrode, to form a bonding pad for external connection.

20. The preparation method according to claim 17, wherein the insulation layer is made of aluminum oxide, silicon nitride, silicon oxide, polyimide or photoresist.

21. The preparation method according to claim 17, wherein the passivation layer is made of diamond-like carbon, silicon nitride, aluminum oxide or gold.

22. The preparation method according to claim 17, wherein the magnetization directions of the pinning layers of the magnetoresistive thin-film materials are set through high temperature annealing in a magnetic field.

23. The preparation method according to claim 17, wherein the first relevant process comprises photoetching, ion etching, reactive ion etching, wet etching, stripping, or hard masking.

24. The preparation method according to claim 17, wherein the second relevant process comprises photoetching, ion etching, reactive ion etching, or wet etching.

25. The preparation method according to claim 17, wherein the through hole is a self-aligned contact hole, and the self-aligned contact hole is formed by stripping the magnetoresistive thin-film materials, and is formed by using an ion etching process or by using hard masking and a chemical mechanical polishing process.

26. A preparation method of a single-chip differential free layer push-pull magnetic field sensor bridge, wherein the method comprises the following steps:
1) forming a deep TSV hole on a substrate by a DRIE process;
2) electroplating a TSV Cu pillar in the deep hole;
3) flattening the electroplated TSV Cu pillar higher than the surface of the substrate;
4) depositing a stacked layer of magnetoresistive thin-film materials on the substrate, such that the electrode position is connected to the TSV Cu pillar of an etched window, and setting pinning layer magnetization directions of the magnetoresistive thin-film materials;

5) establishing a bottom electrode, and establishing patterns of magnetoresistive sensing units on the magnetoresistive thin-film materials by using a first relevant process;
6) depositing a second insulation layer above the magnetoresistive sensing units, and forming a through hole for electrically interconnecting the magnetoresistive sensing units through a second relevant process;
7) depositing a top metal layer above the through hole, forming a top electrode through the first relevant process, and wiring among the magnetoresistive sensing units;
8) depositing a third insulation layer above the top metal layer;
9) depositing a soft magnetic flux concentrator above the third insulation layer;
10) depositing a passivation layer above the soft magnetic flux concentrator;
11) thinning the back of the substrate, to expose the TSV Cu pillar; and
12) forming a TSV bonding pad on the bottom of the substrate, and connecting the TSV bonding pad to the TSV Cu pillar.

27. The preparation method according to claim 26, wherein, between steps 3) and 4), the method further comprises:
depositing and patterning a reset coil conductor on the substrate, such that output and input ends of an electrode thereof are connected to the Cu pillar, and depositing a first insulation layer on the surface of the reset coil conductor; and
step 4) is: etching a window of the first insulation layer, and depositing a stacked layer of the magnetoresistive thin-film materials on the substrate on the surface of the first insulation layer, such that the electrode position is connected to the TSV Cu pillar of the etched window, and setting pinning layer magnetization directions of the magnetoresistive thin-film materials.

28. The preparation method according to claim 26, wherein the step 8) is depositing a third insulation layer above the top metal layer, opening a window of the third insulation layer, and depositing and patterning the test coil conductor above the third insulation layer, such that output and input electrodes thereof are connected to the TSV Cu pillar.

* * * * *